United States Patent [19]

Vandervorst et al.

[11] Patent Number: 5,369,372
[45] Date of Patent: Nov. 29, 1994

[54] METHOD FOR RESISTANCE MEASUREMENTS ON A SEMICONDUCTOR ELEMENT WITH CONTROLLED PROBE PRESSURE

[75] Inventors: Wilfried Vandervorst, Mechelen; Marc Meuris, Keerbergen, both of Belgium

[73] Assignee: Interuniversitair Micro Elektronica Centrum vzw, Leuven-Heverlee, Belgium

[21] Appl. No.: 838,419
[22] PCT Filed: Jul. 9, 1991
[86] PCT No.: PCT/EP91/01294
  § 371 Date: Mar. 9, 1992
  § 102(e) Date: Mar. 9, 1992
[87] PCT Pub. No.: WO92/01233
  PCT Pub. Date: Jan. 23, 1992

[51] Int. Cl.5 .......................... G01R 27/08
[52] U.S. Cl. ............... 324/719; 324/715; 324/724; 250/306
[58] Field of Search ........... 324/715, 717, 718, 719, 324/722, 724, 158 P, 158 R; 250/306

[56] References Cited

U.S. PATENT DOCUMENTS

| | | | |
|---|---|---|---|
| 3,590,372 | 6/1971 | DeSantis et al. | 324/158 P |
| 3,835,381 | 9/1974 | Garretson et al. | 324/158 P |
| 4,343,993 | 8/1982 | Binnig et al. | 250/306 |
| 4,422,002 | 12/1983 | Binnig et al. | 310/328 |
| 4,550,257 | 10/1985 | Binnig et al. | 250/492.2 |
| 4,992,728 | 2/1991 | McCord et al. | 324/158 P |
| 5,017,266 | 5/1991 | Zdeblick et al. | 156/643 |
| 5,055,778 | 10/1991 | Okubo et al. | 324/158 P |

FOREIGN PATENT DOCUMENTS 3843877 2/1990 Germany .
55-60869 5/1980 Japan .................. 324/719

OTHER PUBLICATIONS

Analysis of Microelectronic Materials and Devices, M. Grasserbauer and H. W. Werner, Chapter 3.3, *Scanning Tunnelling Microscopy (STM)*, G. F. A. van de Walle et al., 1991.
IBM *Technical Disclosure Bulletin;* vol. 26, No. 7B Dec. 1983, pp. 3579–3580 "Closed–Loop Control of the 'Z' Stage of a Wafer Prober", W. R. Smith.
*International Test Conference 1989 Proceedings;* Paper 8.3; Aug. 29–31, 1989, pp. 208–215; "An Analysis of Tungsten Probes' Effect on Yield In A Production Wafer Probe Environment" N. Nadeau and S. Perrault.
*Radio Fernsehen Elektronic;* Berlin 34 (1985) 7, pp. 415–417; "Elektrisches Kontaktverhalten von Sondennadeln" Ing. Frank Bage.

Primary Examiner—Gerard R. Strecker
Assistant Examiner—Diep Do
Attorney, Agent, or Firm—Ostrolenk, Faber, Gerb & Soffen

[57] ABSTRACT

A method for measuring the resistance or conductivity between two or more conductors which are placed against a semiconductor element, wherein in order to bring the contact resistance between the conductors and the element to, to hold it at, a predetermined value during measuring, the conductors are held at a constant distance and/or under constant pressure relative to the semiconductor element.

10 Claims, 1 Drawing Sheet

METHOD FOR RESISTANCE MEASUREMENTS ON A SEMICONDUCTOR ELEMENT WITH CONTROLLED PROBE PRESSURE

BACKGROUND OF THE INVENTION

A known technique for measurement of resistance on a semiconductor element is called a Spreading Resistance Probe (SRP). A semiconductor element is herein cut obliquely and the resistance between in each case two probe points placed on the surface is measured. These probe points or conductors are placed at an interval of approximately 15 to 50 $\mu$m. The angle of inclination is in the region of several minutes to several degrees. The conductors are stepped over the obliquely cut portions with a step size in each case of 2.5 to 5 $\mu$m. In the SRP technique the resistance measurement can take place with both direct voltage and alternating voltage.

A problem here is the deviation in the contact resistance between conductor and semiconductor element. The point of the conductor is accurately polished, which can sometimes take days, until the contact resistance on a calibration sample reaches a predetermined value. Even after the time-consuming calibration of the points of the conductors the deviation in the contact resistance results in inaccuracies in the measurements.

SUMMARY OF THE INVENTION

The present invention has for its object to provide a new method wherein the accuracy of resistance measurements on a semiconductor element is considerably improved.

For this purpose the invention provides a method for measuring the resistance or conductivity between two or more conductors which are placed against a semiconductor element, wherein in order to bring the contact resistance between the conductors and the element to, and hold it at, a predetermined value during measuring, the conductors are held at a constant distance and/or under constant pressure relative to the semiconductor element.

The preferred embodiments of the method (and the device) according to the present invention are disclosed and claimed herein.

BRIEF DESCRIPTION OF THE DRAWINGS

Further details, features and advantages of the present invention will become apparent in the light of the following description of a preferred embodiment according to the present invention with reference to the annexed drawings, in which.

DETAILED DESCRIPTION

Figure 1:
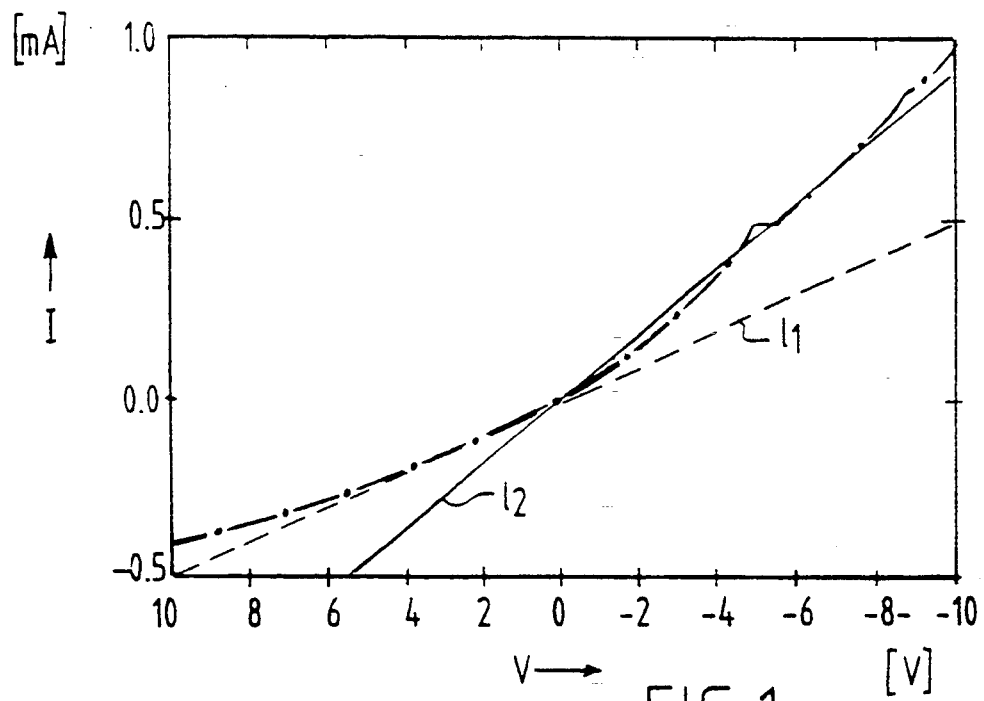
FIG. 1 shows a graph of a current-voltage characteristic measured on a first semiconductor element and according to a first preferred method according to the present invention.
Figure 2:
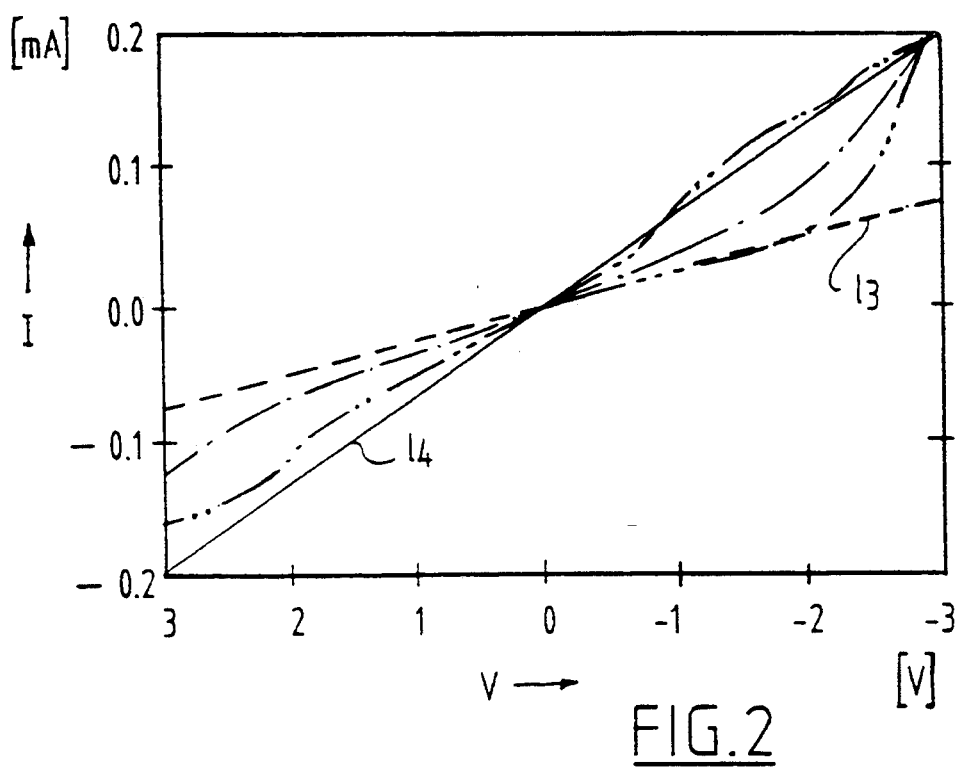
FIG. 2 shows a graph of a current-voltage characteristic measured on a second semiconductor element and according to a second preferred method according to the present invention.

FIG. 1 and 2 are measured using an AFM arrangement (Atomic Force Microscopy). Herein a semiconductor element is movable three-dimensionally with piezo-crystals, a first of which adjusts the pressure or distance of a conducting needle relative to the semiconductor element, while two others enable a movement over the surface of the semiconductor element. A laser beam is directed onto the contact point of the conductor and the semiconductor element. The reflection of the laser beam is picked up by a photodiode, a the output of the photodiode is fed back to the first mentioned piezo-crystal.

In the measured graphs use is made of a tungsten wire of 20 $\mu$m diameter which is cut to a point. The curve of FIG. 1 is measured on a semiconductor element with a relatively high resistivity, $\rho \approx 4.7$ $\Omega$.cm. Applying a pressure force of constant value between the conductor and the semiconductor element results in an approximately linear current-voltage characteristic $l_1$ at negative voltage and $l_2$ at positive voltage.

FIG. 2 shows measurements on a substrate with a comparatively smaller resistivity $\rho \approx 0.0084$ $\Omega$.cm. Different measurements are indicated with different curves in FIG. 2 and show an approximately linear relation ($l_3$ and $l_4$), wherein the angles of slope of the lines ($l_3$ and $l_4$) are dependent on the applied pressure between conductor and semiconductor element.

By applying the pressure between the semiconductor element and the conductor, this conductor penetrates through a thin oxide layer which in practice is almost always present on the semiconductor element. The pressure can be held very constant because of feedback to the first mentioned piezo-crystal. Using the two above mentioned piezo-crystals the conductors are moved over the surface for measuring the resistance or conductivity along the sloping surface, wherewith the resistance at different depths in the semiconductor element becomes known.

Another technique which makes use in accurate manner of the control of movement of a conductor over a semiconducting element, for instance, is so-called Scanning Tunneling Microscopy, wherein use is made of the tunnel flow between the conductor and the semiconducting element for holding the conductor at constant distance relative to the surface of that element. The oxide layer over the semiconductor element can form a problem here.

An important novel feature of the method according to the present invention relates to the possibility of measuring either with DC current and/or voltage, or AC voltage or current.

Good results have been obtained by measuring with AC voltage and using a DC bias voltage.

We claim:

1. A method of measuring resistance or conductivity at a surface of a semiconductor element, comprising the steps of:
   (a) placing at least two conductors in contact with said surface;
   (b) adjusting the contact pressure between the conductors and the surface using a scanning proximity microscope to obtain an approximately linear voltage-current (VI) characteristic between the conductors;
   (c) measuring resistance or conductivity between said conductors after step (b); and
   (d) changing the position of at least one of the two conductors; and
   (e) repeating step (c) while maintaining the contact pressure at the value achieved in step (b).

2. A method as claimed in claim 1, wherein the measurement is made according to the Spreading Resistance Probe technique (SRP).

3. A method as claimed in claim 1, wherein the conductors are manufactured from tungsten.

4. A method as claimed in claim 3, wherein the conductors are made of a tungsten thread of 20 μm diameter on which a point has been cut.

5. A method according to claim 4, wherein the Scanning Proximity Microscope is an STM (Scanning Tunneling Microscope).

6. A method as claimed in claim 1, wherein a force is applied between the element and the conductors to control said contact such that the conductors penetrate through a layer of natural oxide on the element.

7. A method according to claim 1, wherein the resistance or conductivity is measured using DC voltage (current) and/or AC voltage (current).

8. A method according to claim 7, wherein the resistance or conductivity is measured with AC voltage and a DC bias voltage.

9. A method as claimed in claim 1, wherein the scanning proximity microscope is an AFM (Atomic Force Microscope).

10. A method as claimed in claim 1, wherein the scanning proximity microscope is an STM (Scanning Tunneling Microscope).

* * * * *